(12) United States Patent
Lin et al.

(10) Patent No.: US 12,513,857 B2
(45) Date of Patent: Dec. 30, 2025

(54) HEAT DISSIPATING STRUCTURE OF A POWER SUPPLY

(71) Applicant: ACBEL POLYTECH INC., New Taipei (TW)

(72) Inventors: Chia-Hao Lin, New Taipei (TW); Tse-Jung Kuo, New Taipei (TW); Min-Che Tu, New Taipei (TW)

(73) Assignee: ACBEL POLYTECH INC., New Taipei (TW)

( * ) Notice: Subject to any disclaimer, the term of this patent is extended or adjusted under 35 U.S.C. 154(b) by 204 days.

(21) Appl. No.: 18/388,202

(22) Filed: Nov. 9, 2023

(65) Prior Publication Data

US 2024/0365515 A1    Oct. 31, 2024

(30) Foreign Application Priority Data

Apr. 26, 2023   (TW) .................................. 112115547

(51) Int. Cl.
*H05K 7/20* (2006.01)

(52) U.S. Cl.
CPC .................................. *H05K 7/2039* (2013.01)

(58) Field of Classification Search
CPC .... H05K 7/2039; H05K 7/209; H05K 7/1427; H05K 7/20; H05K 7/20409; H05K 7/20436; H05K 7/2089; H05K 1/0203; H05K 1/0204; H05K 5/0247; H05K 5/03; H05K 7/14; H05K 7/1432; H05K 7/1492; H05K 7/20472; H02J 7/0045; H02J 7/00036; G02B 6/4272; G02B 6/4292;
(Continued)

(56) References Cited

U.S. PATENT DOCUMENTS

| 5,258,888 A | * | 11/1993 | Korinsky | ............... H05K 7/209 D13/184 |
| 11,930,602 B2 | * | 3/2024 | Lee | .................... H05K 7/20445 |

(Continued)

FOREIGN PATENT DOCUMENTS

| CN | 103547111 B | 8/2016 |
| CN | 206490569 U | 9/2017 |
| CN | 210579871 U | 5/2020 |

OTHER PUBLICATIONS

Electric Device Radiating Heat Uniformly, Guo et al. CN1942084 (Year: 2007).*

*Primary Examiner* — Michael A Matey
(74) *Attorney, Agent, or Firm* — WPAT, PC (57) ABSTRACT

A heat dissipating structure of a power supply is disposed on an inner side of a casing and has two heat dissipating covers configured to be connected with each other, and a heat dissipating sleeve annularly mounted on and around the two heat dissipating covers and disposed between the heat dissipating covers and the casing. The heat dissipating sleeve is able to be bent according to an internal structure of the casing for attaching to the casing and increasing contact area between the heat dissipating sleeve and the casing. The heat from an interior of the power supply can be conducted to the two heat dissipating covers for a first heat spreading and then to the heat dissipating sleeve for a second heat spreading. Thus, speed of heat dissipation to an exterior of the casing can be increased and temperature inside the power supply can be effectively reduced.

8 Claims, 10 Drawing Sheets

(58) Field of Classification Search
CPC .............. H01M 10/613; H01M 10/615; H01R 12/722; H01R 13/502; H01R 13/66
See application file for complete search history.

(56) References Cited

U.S. PATENT DOCUMENTS

2014/0009891 A1* 1/2014 Chen .................... H05K 7/2039
  361/720
2018/0338386 A1* 11/2018 Chen .................... H05K 9/0047

\* cited by examiner

HEAT DISSIPATING STRUCTURE OF A POWER SUPPLY

BACKGROUND OF THE INVENTION

1. Field of the Invention

The present invention relates to a power supply, especially to a heat dissipating structure of a power supply.

2. Description of the Prior Art(s)

A power supply is a device that converts alternating current into stable direct current to supply to electronic equipment. Currently, development of the power supply focuses on improving power density with the goal of reducing a size of the power supply as much as possible under the same output power. However, as the size of the power supply reduces, a surface area of a casing of the power supply decreases, such that a heat dissipation area of the power supply is also reduced accordingly. Consequently, temperature of the casing rises due to slow heat dissipation, resulting in various problems caused by high temperature. Furthermore, in recent years, due to consumers' requirements and attention to special shape of the power supply, appearance of the casing has varied, which further causing uneven temperature distribution of the casing and making the problem of high temperature more difficult to solve.

Figure 10:
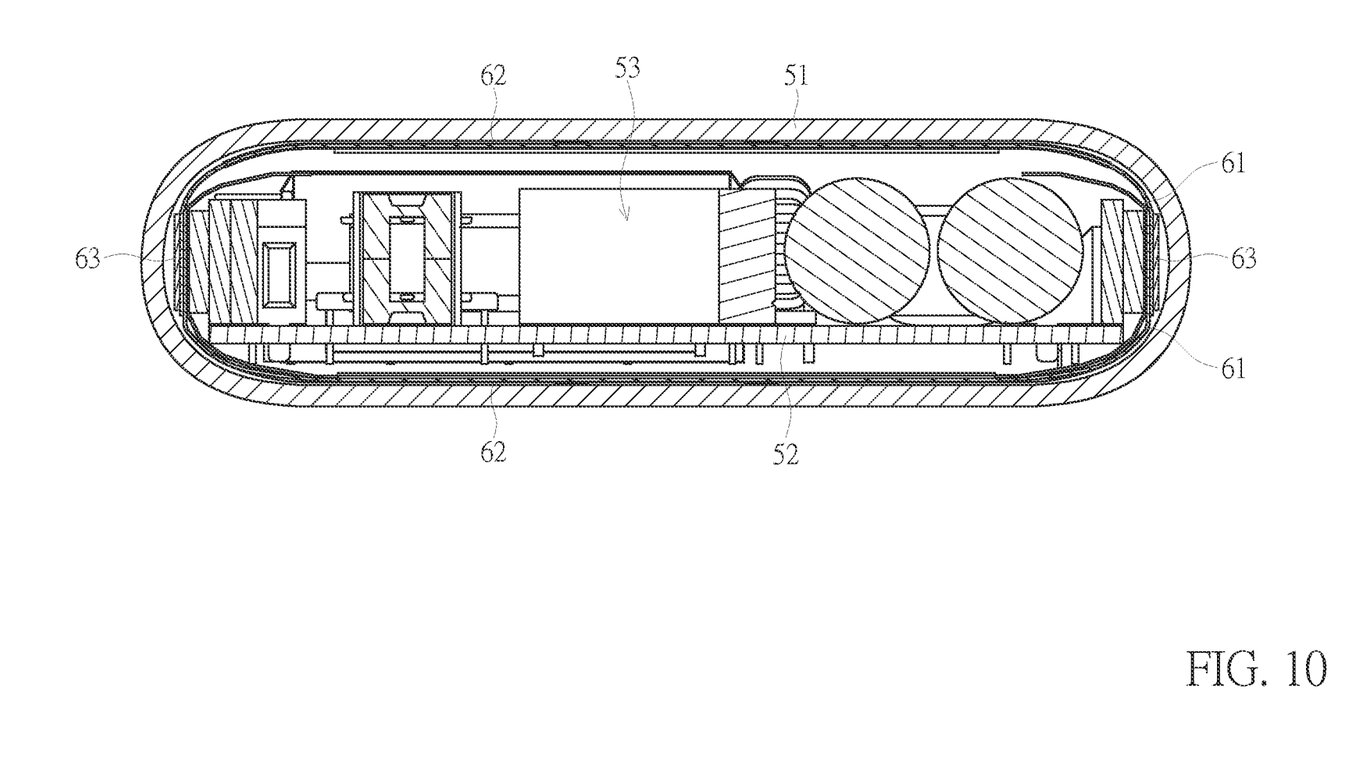
FIG. 10 is a cross-sectional front view of a power supply with a conventional heat dissipating structure in accordance with the prior art.

With reference to FIG. 10, a conventional power supply comprises a casing 51 and a circuit board 52 mounted in the casing 51. A power-converting module 53 is mounted on the circuit board 52 and is configured for converting electrical energy. A heat dissipating structure is mounted inside the casing 51, is disposed around the circuit board 52 and the power-converting module 53, and conducts heat, which is generated by the circuit board 52 and the power-converting module 53 during operation, to the casing 51 to dissipate the heat to an exterior of the casing 51.

Furthermore, the heat dissipating structure includes two heat dissipating covers 61. Each of the heat dissipating covers 61 is substantially U-shaped in cross-section. The two heat dissipating covers 61, one on top and the other on bottom, cover the circuit board 52 and the power-converting module 53. In order to avoid the heat to be dissipated from being concentrated in one place on the casing 51 and forming hot spots, a heat transfer plate 62, which may be made of aluminum, is provided on each of the heat dissipating covers 61 to conduct heat from the heat dissipating covers 61 laterally in advance. Moreover, a heat transfer strip 63, which may be made of aluminum, is mounted in each rounded corner of the casing 51, to fill gap between the heat dissipating covers 61 and the casing 51. The heat dissipating structure allows the heat from the heat dissipating covers 61 to be conducted evenly to the casing 51 as much as possible, thereby making the overall temperature of the casing 51 uniform and avoiding said hot spots on the casing 51. Thus, the heat generated by the circuit board 52 and the power-converting module 53 can be dissipated quickly, and a surface temperature of the casing 51 can comply with relevant specifications for safe-to-touch temperature.

The problem with the afore-mentioned heat dissipating structure is that each of the heat transfer plates 62 and each the heat transfer strips 63 made of metal are individually combined on a corresponding one of the covers 61 by adhering, riveting or welding. Therefore, the heat from the circuit board 52 or the power-converting module 53 would be conducted to the two heat dissipating covers 61 for a first heat spreading, to the heat transfer plates 62 and the heat transfer strips 63 for a second heat spreading, and then to the casing 51. The heat transfer plates 62 and the heat transfer strips 63 are individually attached to the heat dissipating covers 61 without any overlap or contact with each other. Therefore, direct heat conduction between the heat transfer plates 62 and the heat transfer strips 63 are not possible, causing large temperature differences between the heat transfer plates 62 and the heat transfer strips 63. Since the casing 51 is usually made of plastic with poor thermal conductivity, it is not easy to further spread the heat on the casing 51 when the heat is transferred from the heat transfer plates 62 and the heat transfer strips 63 to the casing 51.

In addition, the heat transfer strips 63 disposed at the round corners of the casing 51 would be unable to fill up the gaps between the heat dissipating covers 61 and the casing 51 due to structural limitation, causing air to form thermal resistance between the casing 51 and the heat transfer strips 63. As a result, the heat transfer strips 63 is unable to conduct the heat due to the thermal resistance formed by the air. Consequently, a large temperature difference is formed between the heat transfer strips 63 and the heat transfer plates 62, which would cause hot spots formed on the casing 51 and affect heat dissipation of electronic components inside the power supply.

To overcome the shortcomings, the present invention provides a heat dissipating structure of a power supply to mitigate or obviate the aforementioned problems.

SUMMARY OF THE INVENTION

The main objective of the present invention is to provide a heat dissipating structure of a power supply. The heat dissipating structure is configured to be disposed on an inner side of a casing of the power supply and has two heat dissipating covers and a heat dissipating sleeve. The two heat dissipating covers are configured to be connected with each other. The heat dissipating sleeve annularly covers outer side surfaces of the two heat dissipating covers and is disposed between the heat dissipating covers and the casing. A shape of the heat dissipating sleeve matches a shape of an inner sidewall of the casing. The heat dissipating sleeve abuts against the inner sidewall of the casing.

The heat dissipating sleeve is able to be bent according to an internal structure of the casing for attaching to the casing, such that contact area between the heat dissipating sleeve and the casing can be increased. The heat from an interior of the power supply can be conducted to the two heat dissipating covers for a first heat spreading and then to the heat dissipating sleeve for a second heat spreading. Now that the contact area between the heat dissipating sleeve and the casing has been increased, speed of heat dissipation to an exterior of the casing can be increased and temperature inside the power supply can be effectively reduced.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
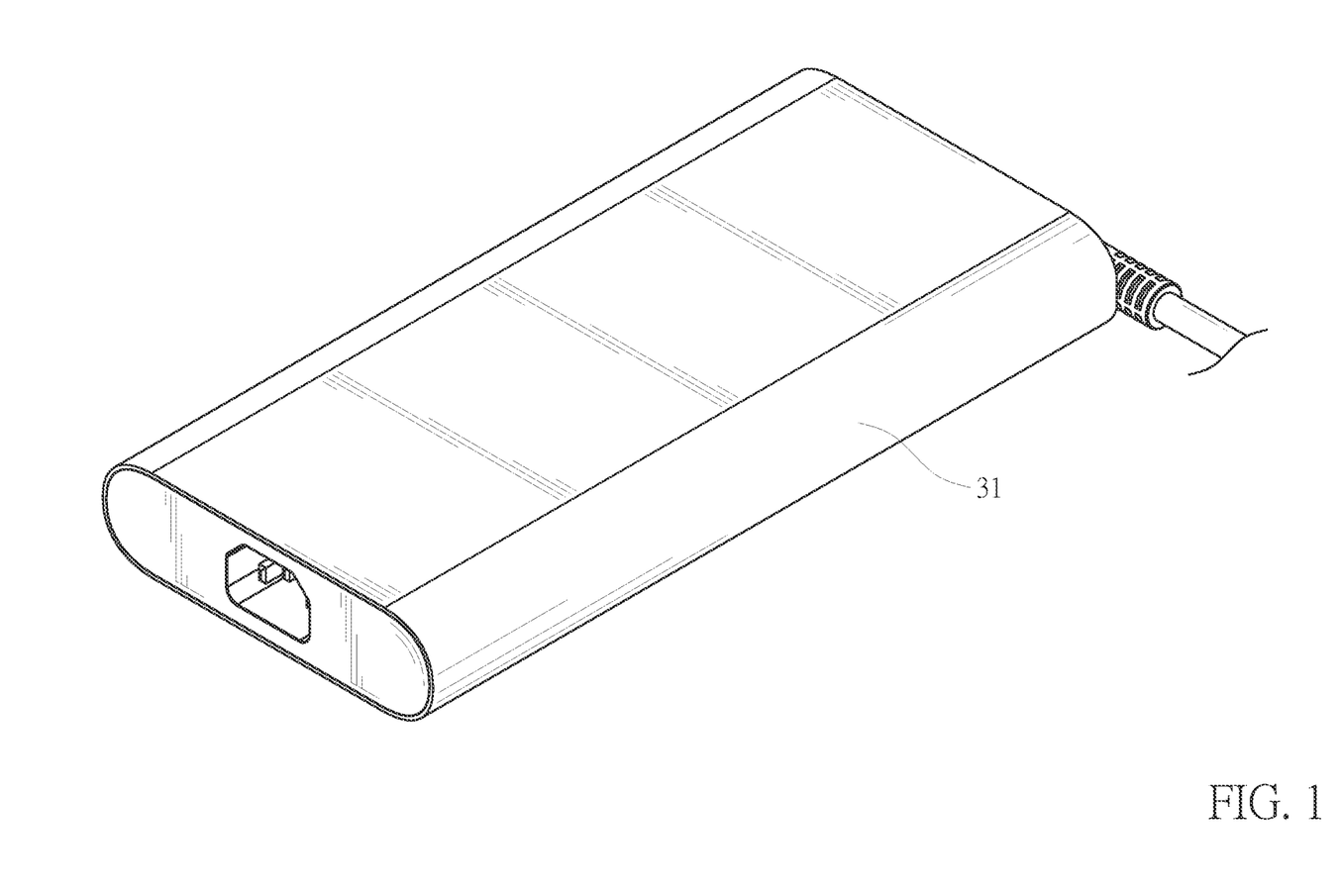
FIG. 1 is a perspective view of a first embodiment of a power supply with a heat dissipating structure in accordance with the present invention.
Figure 2:
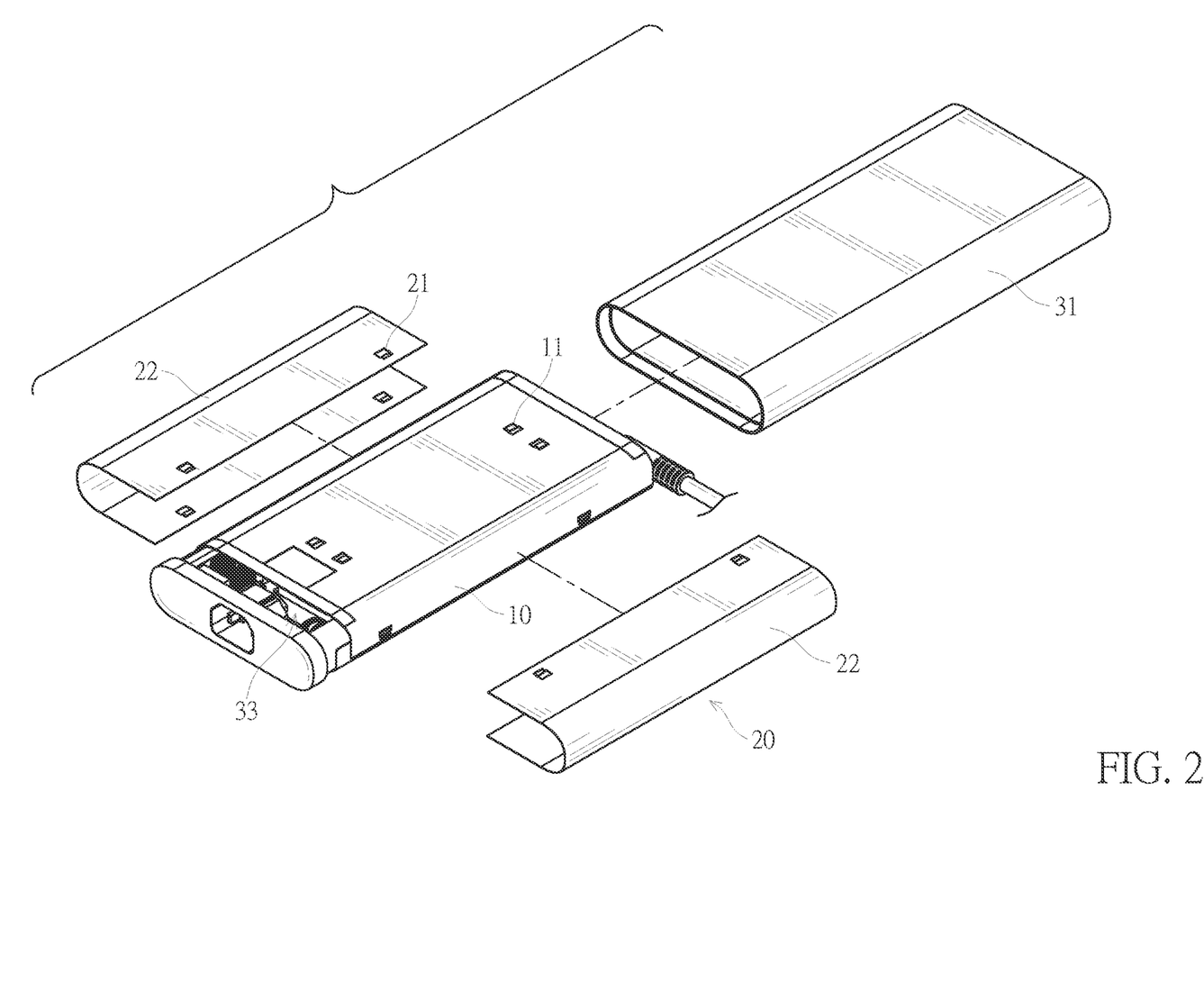
FIG. 2 is an exploded perspective view of the power supply with the heat dissipating structure in FIG. 1.
Figure 3:
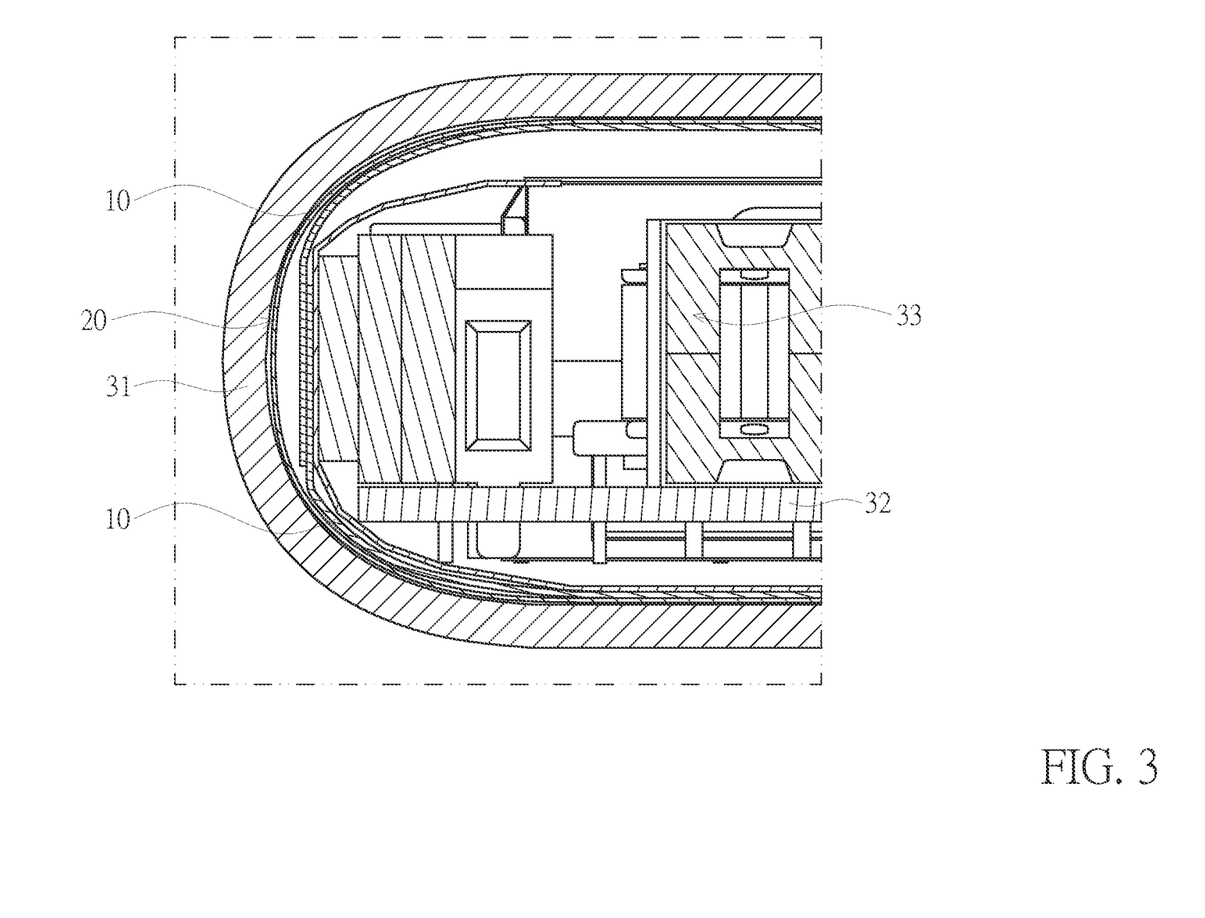
FIG. 3 is an enlarged cross-sectional front view of the power supply with the heat dissipating structure in FIG. 1.

With reference to FIGS. 1 to 3, a heat dissipating structure of a power supply in accordance with the present invention is configured to be disposed on an inner side of a casing 31 of the power supply and mounted around a circuit board 32 and a power-converting module 33 of the power supply. The heat dissipating structure includes two heat dissipating covers 10 and a heat dissipating sleeve 20.

With reference to FIGS. 2 and 3, each of the heat dissipating covers 10 is substantially U-shaped in cross-section. The two heat dissipating covers 10 are configured to be connected with each other with one on top and the other on bottom to wrap the circuit board 32 and the power-converting module 33 inside the two heat dissipating covers 10. Each of the heat dissipating covers 10 has at least one inner engaging structure 11.

Figure 4:
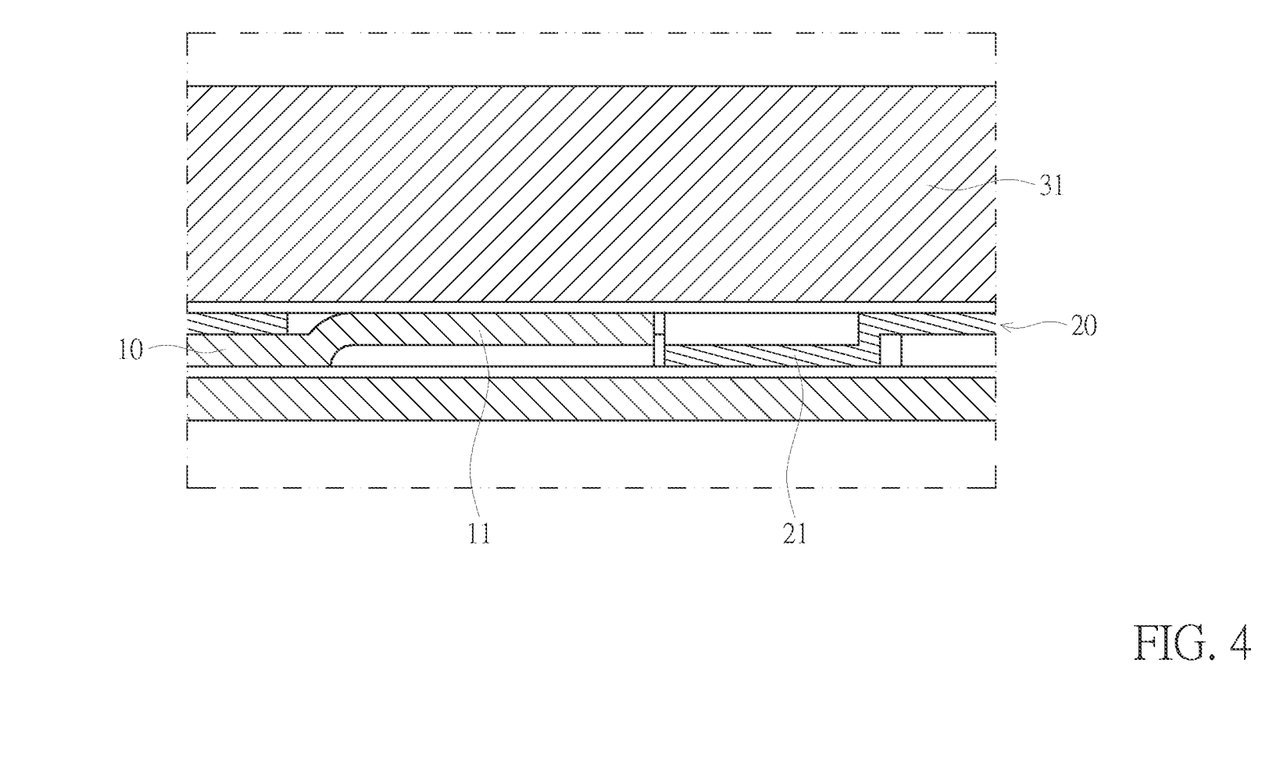
FIG. 4 another enlarged cross-sectional front view of the power supply with the heat dissipating structure in FIG. 1.

The heat dissipating sleeve 20 annularly covers outer side surfaces of the heat dissipating covers 10, is disposed between the heat dissipating covers 10 and the casing 31. A shape of the heat dissipating sleeve 20 matches a shape of an inner sidewall of the casing 31 and the heat dissipating sleeve 20 abuts against the inner sidewall of the casing 31. The heat dissipating sleeve 20 has multiple outer engaging structures 21. With further reference to FIG. 4, the outer engaging structures 21 correspond in position to and engage with the inner engaging structures 11 of the two heat dissipating covers 10 respectively, so as to fix a relative position of the heat dissipating sleeve 20 and the heat dissipating covers 10. However, the heat dissipating sleeve 20 and the heat dissipating covers 10 are not limited to be connected with each other via the inner engaging structures 11 and the outer engaging structures 21. The heat dissipating sleeve 20 and the heat dissipating covers 10 may also be connected with each other by adhesive as long as the relative position of the heat dissipating sleeve 20 and the heat dissipating covers 10 can be fixed.

As shown in FIG. 2, in a first preferred embodiment of the present invention, the heat dissipating sleeve 20 is made up of two half-sleeves 22. Each of the half-sleeves 22 is U-shaped in cross-section. The two half-sleeves 22 are connected with each other with one on left and the other on right, and completely cover the outer side surfaces of the heat dissipating covers 10.

Figure 5:
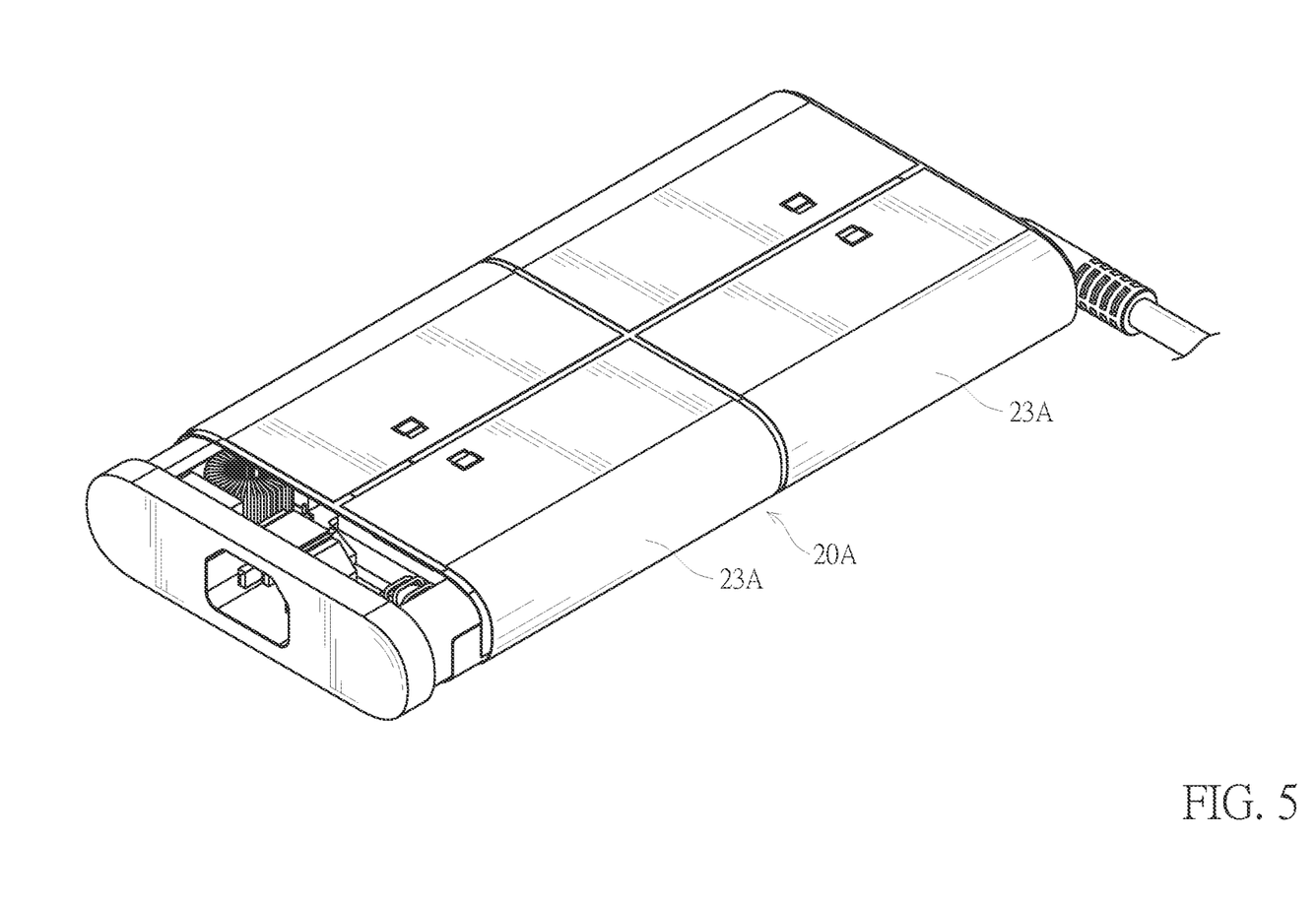
FIG. 5 is a perspective view of a second embodiment of a power supply with a heat dissipating structure in accordance with the present invention, showing a casing being omitted.
Figure 6:
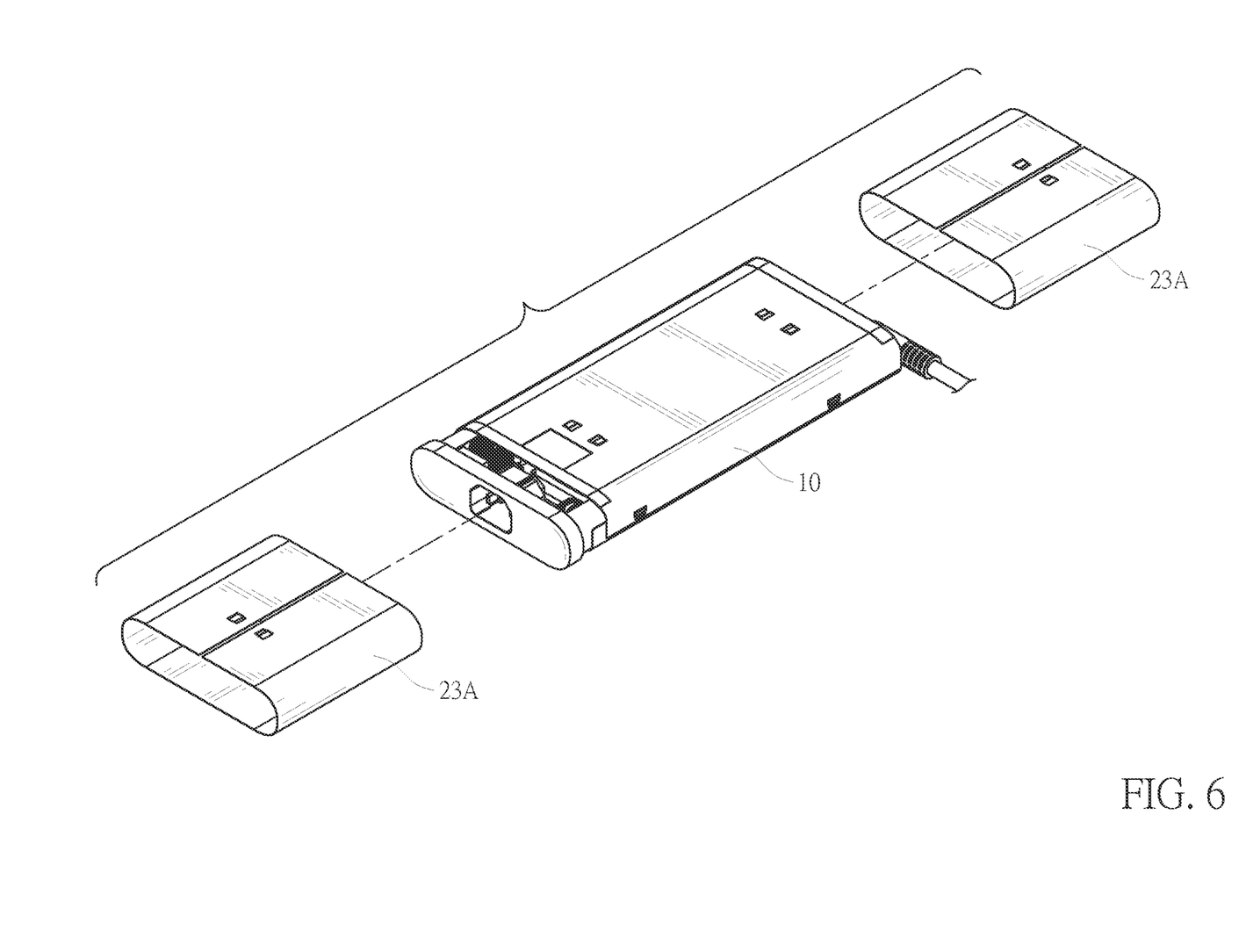
FIG. 6 is an exploded perspective view of the power supply with the heat dissipating structure in FIG. 5.

With further reference to FIGS. 5 and 6, in a second preferred embodiment of the present invention, the heat dissipating sleeve 20A includes two annular sub-sleeves 23A. Each of the annular sub-sleeves 23A is ring-shaped, such that the two annular sub-sleeves 23A are sleeved around the outer side surfaces of the heat dissipating covers 10 with one on front and the other on rear and completely cover the outer side surfaces of the heat dissipating covers 10. Specifically, each of the annular sub-sleeves 23A may be formed by bending a long sheet into annular.

Figure 7:
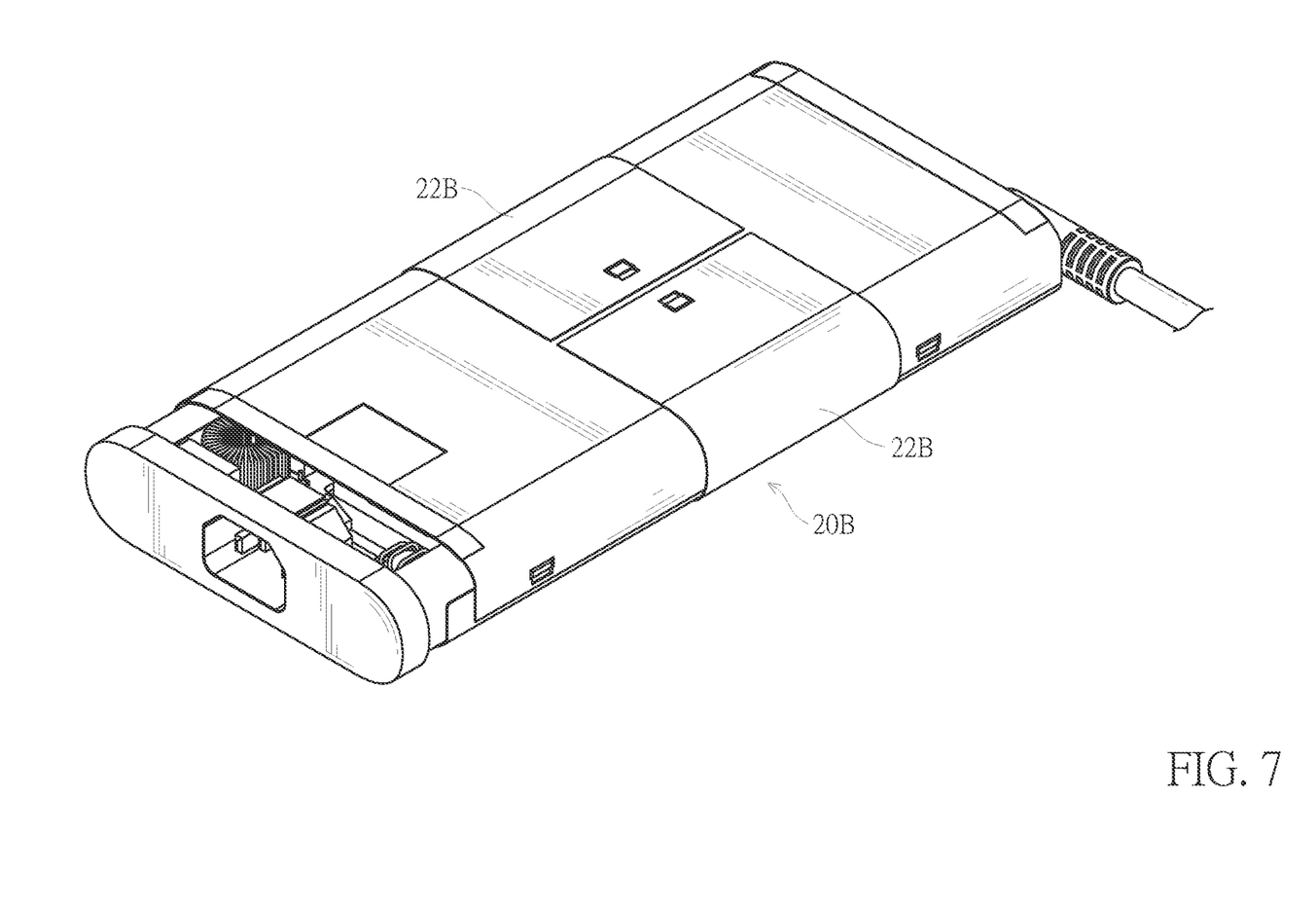
FIG. 7 is a perspective view of a third embodiment of a power supply with a heat dissipating structure in accordance with the present invention, showing a casing being omitted.
Figure 8:
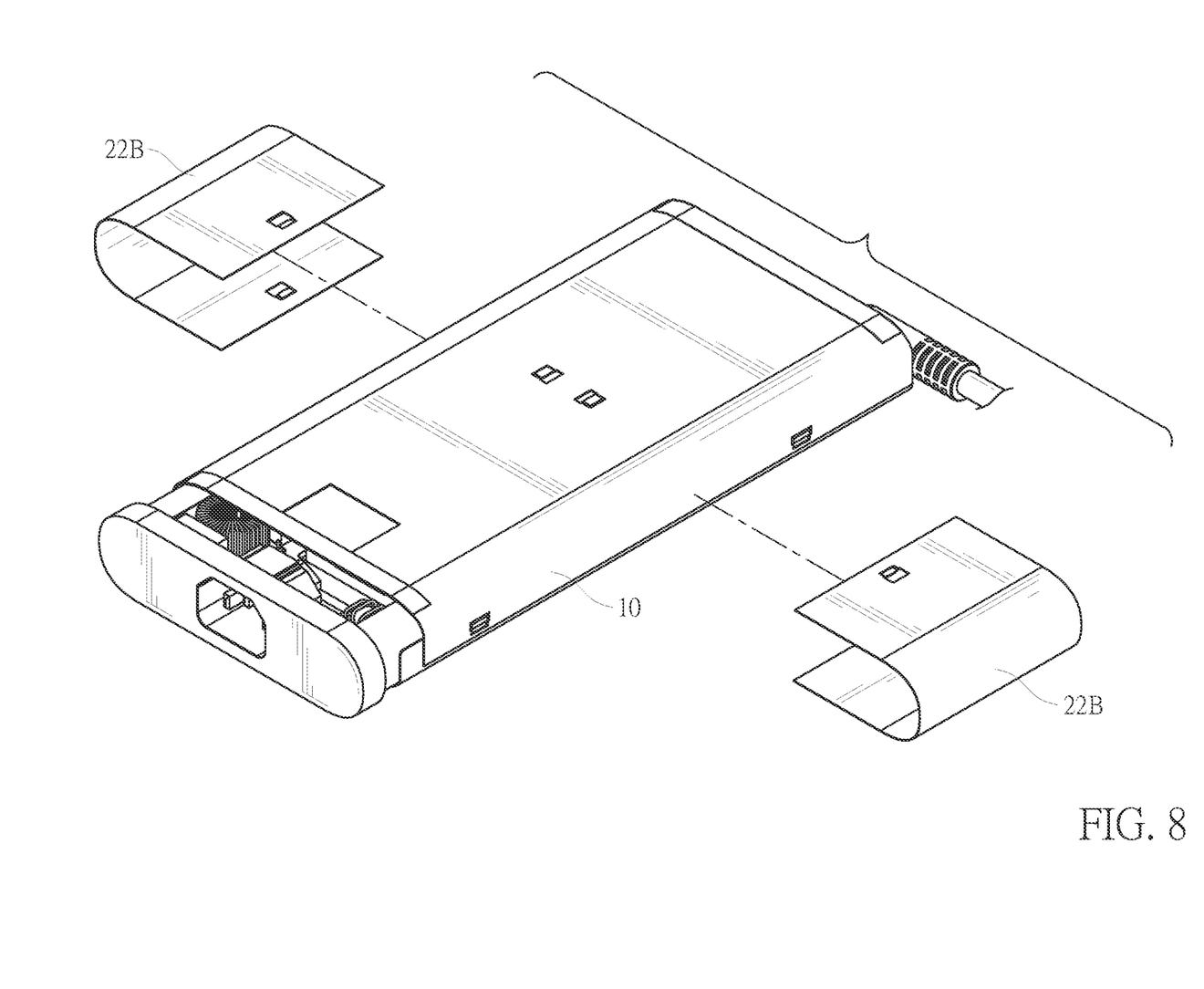
FIG. 8 is an exploded perspective view of the power supply with the heat dissipating structure in FIG. 7.

With further reference to FIGS. 7 and 8, in a third preferred embodiment, which is similar to the first preferred embodiment, of the present invention, the heat dissipating sleeve 20B is made up of two half-sleeves 22B. The two half-sleeves 22B are configured to be connected with each other with one on left and the other on right, and only cover part of the outer side surfaces of the heat dissipating covers 10.

Figure 9:
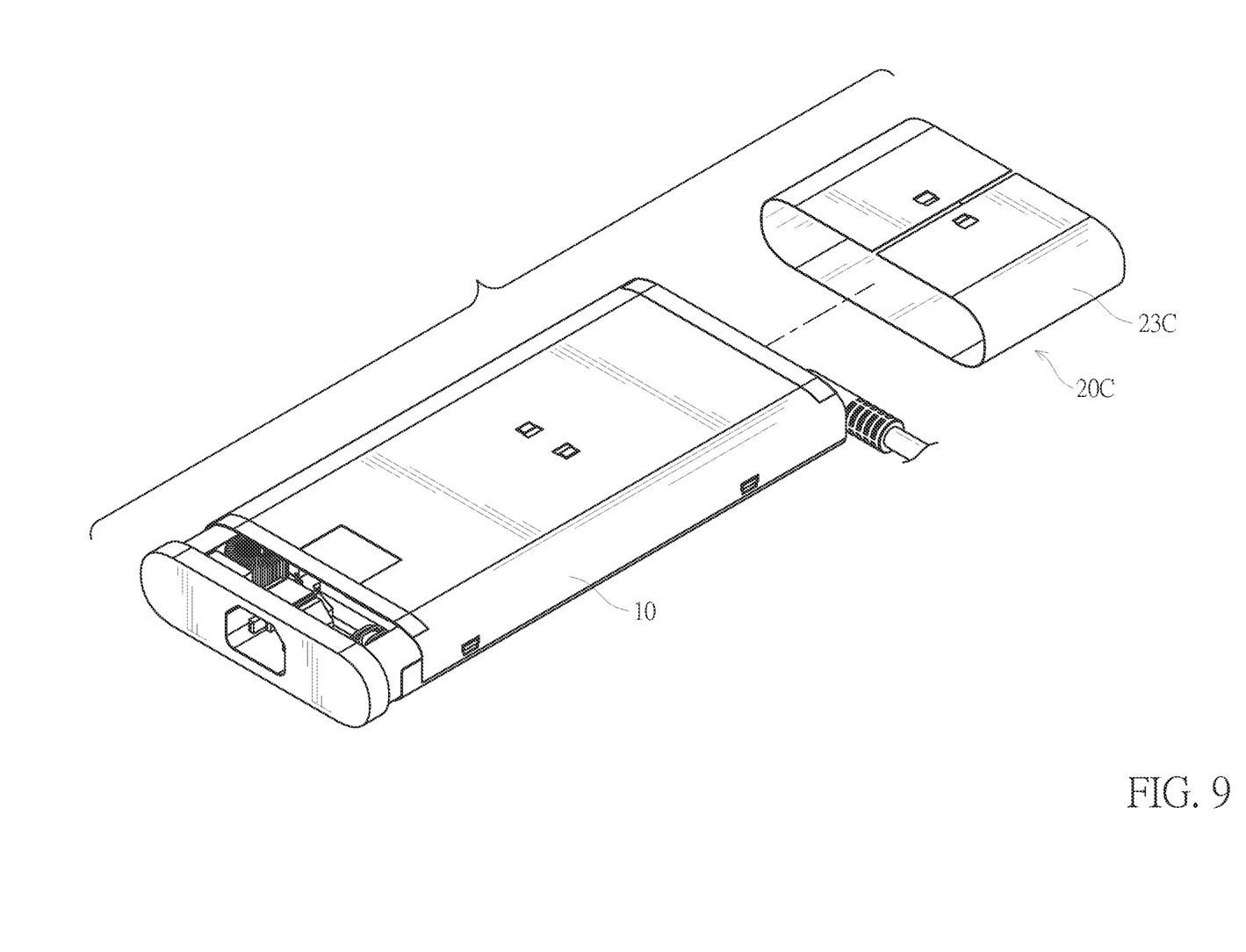
FIG. 9 is an exploded perspective view of a fourth embodiment of a power supply with a heat dissipating structure in accordance with the present invention, showing a casing being omitted.

With further reference to FIG. 9, in a fourth preferred embodiment, which is similar to the second preferred embodiment, of the present invention, the heat dissipating sleeve 20C includes one annular sub-sleeve 23C. The annular sub-sleeve 23C is ring-shaped, is sleeved around the outer side surface of the heat dissipating covers 10, and only cover part of the outer side surfaces of the heat dissipating covers 10. Specifically, the annular sub-sleeves 23C May be formed by bending a long sheet into annular.

In the third and fourth embodiments, the heat dissipating sleeve 20B, 20C is shortened to have a desired length for conducting heat from some hot spots on the heat dissipating covers 10, allowing temperature at a position, which corresponds in position to the heat dissipating sleeve 20B, 20C, on the casing 31 to be more uniform. Regarding positions without being covered by the heat dissipating sleeve 20B, 20C, air forms thermal resistance between the heat dissipating covers 31 and the casing 31, and the air blocks the heat from the heat dissipating covers 10, so as to avoid forming hot spots on the casing 31. Positions of the heat dissipating sleeve 20B, 20C on the heat dissipating covers 10 is able to be adjusted according to needs. Therefore, heat insulation effect of the air cooperates with heat spreading effect of the heat dissipating sleeve 20B, 20C to form a good temperature equalization effect on the casing 31 and reduce the hot spots.

Moreover, the heat dissipating covers 10 and the heat dissipating sleeve 20, 20A, 20B, 20C are made of material with good thermal conductivity, such as metal or graphene. The thermal conductivity of the graphene in the horizontal direction is better than that in the vertical direction, so the graphene can provide a good temperature equalization effect. Furthermore, the half-sleeves 22, 22B or the sub-sleeves 23A, 23C forming the heat dissipating sleeve 20, 20A, 20B, 20C can be made of the same or different thermal conductive materials according to distribution of the hot spots on the casing 31, so as to form the good temperature equalization effect. Specifically, in the first and third preferred embodiments, at least one of the two half-sleeves 22, 22B may be made of the graphene; and in the second preferred embodiment, at least one of the two sub-sleeves 23A may be made of the graphene. The half-sleeve 22, 22B or the sub-sleeve 23A made of graphene corresponds in position to the hot spots on the heat dissipating covers 10. Thus, heat from the hot spots of the heat dissipating covers 10 is conducted in a horizontal direction to be uniformly spread on the heat dissipating sleeve 20, 20A, 20B, 20C and then is conducted in a vertical direction to the casing 31 for dissipation.

The heat dissipating structure as described has the following advantages. Since the heat dissipating sleeve 20, 20A, 20B, 20C is able to be bent according to an internal structure of the casing 31 for attaching to the casing 31, contact area between the heat dissipating sleeve 20, 20A, 20B, 20C and the casing 31 can be increased. The heat from the circuit board 32 and the power-converting module 33 inside the power supply during operation can be conducted to the two heat dissipating covers 10 for a first heat spreading and then to the heat dissipating sleeve 20, 20A, 20B, 20C for a second heat spreading. Now that the contact area between the heat dissipating sleeve 20, 20A, 20B, 20C and the casing 31 has been increased, speed of heat dissipation to an exterior of the casing 31 can be increased and temperature inside the power supply can be effectively reduced.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A heat dissipating structure of a power supply, configured to be disposed on an inner side of a casing of the power supply, the heat dissipating structure comprising:
   two heat dissipating covers configured to be connected with each other; and
   a heat dissipating sleeve annularly covering outer side surfaces of the two heat dissipating covers and disposed between the heat dissipating covers and the casing, wherein a shape of the heat dissipating sleeve matches a shape of an inner sidewall of the casing and the heat dissipating sleeve abuts against the inner sidewall of the casing;
   wherein the heat dissipating sleeve includes one annular sub-sleeve being ring-shaped and sleeved around the outer side surface of the heat dissipating covers.

2. The heat dissipating structure as claimed in claim 1, wherein the heat dissipating sleeve completely covers the outer side surfaces of the heat dissipating covers.

3. The heat dissipating structure as claimed in claim 1, wherein the heat dissipating sleeve covers part of the outer side surfaces of the heat dissipating covers.

4. A heat dissipating structure of a power supply, configured to be disposed on an inner side of a casing of the power supply, the heat dissipating structure comprising:
   two heat dissipating covers configured to be connected with each other; and
   a heat dissipating sleeve annularly covering outer side surfaces of the two heat dissipating covers and disposed between the heat dissipating covers and the casing, wherein a shape of the heat dissipating sleeve matches a shape of an inner sidewall of the casing and the heat dissipating sleeve abuts against the inner sidewall of the casing;
   wherein the heat dissipating sleeve includes two annular sub-sleeves, each of the sub-sleeves is ring-shaped and is sleeved around the outer side surface of the heat dissipating covers.

5. The heat dissipating structure as claimed in claim 4, wherein the heat dissipating sleeve completely covers the outer side surfaces of the heat dissipating covers.

6. The heat dissipating structure as claimed in claim 5, wherein the heat dissipating sleeve covers part of the outer side surfaces of the heat dissipating covers.

7. The heat dissipating structure as claimed in claim 4, wherein the two sub-sleeves of the heat dissipating sleeve are made of the same or different thermal conductive materials.

8. The heat dissipating structure as claimed in claim 7, wherein at least one of the two sub-sleeves is made of graphene.

* * * * *